(12) United States Patent
Morris et al.

(10) Patent No.: US 7,743,489 B2
(45) Date of Patent: Jun. 29, 2010

(54) SUBSTRATE SURFACE WITH VARYING ELECTRICAL OR MAGNETIC PROPERTIES

(75) Inventors: William George Morris, Farnborough (GB); Andrew Shaun Treen, Farnborough (GB)

(73) Assignee: QinetiQ Limited (GB)

( * ) Notice: Subject to any disclaimer, the term of this patent is extended or adjusted under 35 U.S.C. 154(b) by 1239 days.

(21) Appl. No.: 10/416,476

(22) PCT Filed: Nov. 8, 2001

(86) PCT No.: PCT/GB01/04931

§ 371 (c)(1),
(2), (4) Date: May 9, 2003

(87) PCT Pub. No.: WO02/38288

PCT Pub. Date: May 16, 2002

(65) Prior Publication Data

US 2004/0025342 A1    Feb. 12, 2004

(30) Foreign Application Priority Data

Nov. 10, 2000    (GB) ................................ 0027510.7

(51) Int. Cl.
*H01C 17/06* (2006.01)
(52) U.S. Cl. .......................... 29/620; 29/423; 29/592.1; 29/610.1
(58) Field of Classification Search ........... 29/592–623, 29/825, 846, 401.1, 423, 840
See application file for complete search history.

(56) References Cited

U.S. PATENT DOCUMENTS

| 2,278,072 | A | * | 3/1942 | Gould et al. ................. 338/328 |
| 4,117,074 | A |   | 9/1978 | Tiersten et al. |
| 4,384,401 | A | * | 5/1983 | Borrup ........................ 29/611 |
| 4,692,653 | A |   | 9/1987 | Kushida et al. |
| 5,181,317 | A | * | 1/1993 | Nishihara et al. .......... 29/401.1 |
| 6,012,779 | A |   | 1/2000 | Morris |

FOREIGN PATENT DOCUMENTS

| EP | 0 372 583 | 6/1990 |
| GB | 2256111 | 11/1992 |
| GB | 2347043 | 8/2000 |
| WO | WO 99/37123 | 7/1999 |

OTHER PUBLICATIONS

Kim, et al., "System Design of Distributed Modal Transducers by Adjusting Spatial Gain Distribution" *Proceedings of the Spie*, vol. 3668, pp. 968-979 (1999).

* cited by examiner

*Primary Examiner*—Rick K Chang
(74) *Attorney, Agent, or Firm*—McDonnell Boenhen Hulbert & Berghoff LLP

(57) ABSTRACT

A substrate including a surface on which is provided a modifying layer which is incomplete and has a distribution such as to provide a plurality of islands of said material and/or islands of substrate surface whereby the surface exhibits a modified electrical and/or magnetic property.

58 Claims, 2 Drawing Sheets

SUBSTRATE SURFACE WITH VARYING ELECTRICAL OR MAGNETIC PROPERTIES

The present invention relates to a method of producing a substrate surface having electrical and/or magnetic properties which can be varied as a function of position on the surface, and to substrates and devices incorporating such a surface.

It is recognised that it would be useful to be able to produce a surface which has an electrical or magnetic property which is a function of position on the surface. For example, a flat-plate loudspeaker or microphone can be constructed to respond optimally to all driver frequencies within a given range if it is provided with a suitably tapering surface impedance or surface resistivity, and there are known ways of approximating the latter, as by the incorporation of discrete electronic or electrical devices into the surface. However, such techniques are complex, and the approximation is relatively poor.

The present invention makes it possible to produce a substrate with electrical and/or magnetic properties which can be varied as a function of position on the surface without needing to add separate discrete devices to the surface.

In a first aspect the invention provides a method of modifying a substrate surface by providing an incomplete modifying layer over at least one portion of said surface, the material of said modifying layer having an intrinsic electrical or magnetic property, and having a distribution such as to provide on the or each said portion a plurality of islands or a net of said material whereby the or each said portion has a modified electrical and/or magnetic property. In one preferred embodiment, substantially all of the surface is so modified, local areas thereof each comprising said islands and/or said nets.

The modifying layer may be provided on the substrate surface by any suitable known means. One technique is to deposit a continuous layer in any known manner followed by selective removal (e.g. by masking and etching) to produce the desired distribution. In another technique the layer is produced by depositing a plurality of small volumes of material on the substrate surface to cover corresponding small local areas in a desired distribution, for example by a known printing technique such as ink-jet or "bubble-jet" printing, or by pre-masking the substrate, for example during vacuum deposition or sputtering. The printing technique facilitates the relatively fast production of such surfaces, and ensures reproducibility thereof.

In either case, the distribution may be such that the material of the modifying layer occupies discrete areas of the substrate, for example in the form of small dots, which may have a random or predetermined shape as appropriate (for example, the shape of a conductive dot may be tailored so that it acts as a resonator at radio frequencies). In such a case the uncovered substrate surface is connected and topologically defines a net about the discontinuous material (islands) of the modifying layer.

Alternatively, the distribution may be such that the material of the modifying layer is more extensive and connected, and defines a net about discrete areas (or islands) of the uncovered substrate surface—for example, printed dots may be of a distribution and size such as to overlap, or a continuous layer may be provided following which portions thereof are removed, in either case to provide a continuity (or net) in the material and a discontinuity in the uncovered substrate surface.

Both types of distribution may be present on the same substrate surface, for example in different local areas of the same modifying layer.

In certain cases, for example when dc conductivity is required, it is clearly necessary to have a corresponding property (e.g. a conductive path) which extends completely across the modified surface area. This is not a problem where the (conductive) material of the modifying layer forms a net about uncovered areas of the substrate surface, even when the latter is completely insulating. However, when the material of the modifying layer forms islands on the surface, it would be necessary for the bulk substrate to have a finite resistivity, or for an insulating bulk substrate to include a surface layer having a finite resistivity, prior to provision of the modifying layer.

It will therefore be understood that the invention includes a method of treating a surface of a substrate to modify its existing dc electrical conductivity, the method comprising providing a modifying layer of electrically conductive material over said surface, said modifying layer being incomplete and with a distribution such as to provide a plurality of islands of said material and/or islands of said substrate surface whereby to modify the impedance of the surface to a desired extent.

When ac electrical characteristics are involved, particularly at rf frequencies, regardless of whether the modifying material forms separate islands or an interconnected net, the substrate to be treated according to the method of the invention may for example be insulating to dc, or have a finite resistivity, or include a surface layer having a finite resistivity. It will therefore be recognised that the invention also encompasses a method of treating a surface of a substrate to provide it with predetermined ac or rf properties, the method comprising providing a modifying layer of electrically conductive material over said surface, said modifying layer being incomplete and with a distribution such as to provide a plurality of islands of said material and/or islands of said substrate surface.

Furthermore, where the property is magnetic, for example magnetic permittivity or permeability, it is not generally necessary for islands of the modifying layer to be physically in contact. The invention therefore includes a method of treating a surface of a substrate to provide it with predetermined magnetic properties, the method comprising providing a modifying layer of a ferromagnetic, ferrimagnetic or antiferrimagnetic material, said modifying layer being incomplete and with a distribution such as to provide a plurality of islands of said material and/or islands of said substrate surface.

In general therefore, whether for dc, ac or magnetic applications, it is possible to provide a modifying layer in which the material is in the form of separate dot-like areas and in many instances this is preferred. It has the advantage that the modifying layer (including dot size shape and distribution) may be more easily defined and controlled.

Control of the distribution includes any one or any combination of island size, island shape, island distribution and density (number of islands per unit area), and the local thickness of the modifying layer material.

The precise local distribution of the islands of modifying material of uncovered substrate may be regular, or regularly varying (if a graded property is required in the surface), or have a random or quasi-random element. Thus, the pattern of dots could be generated by a computer instructed to provide a pattern in which the local dot density on a medium scale follows a predetermined function, but with no proviso as to what happens on a smaller scale.

While it is possible to provide a quasi-uniform distribution in the modifying layer, by controlling and varying the local distribution of the modifying layer material, so that the modified property has substantially the same value across the substrate surface, more importantly an average local surface property such as electrical resistivity or magnetic permittivity can be varied as a function of position on the surface. Such variation may be linear or non-linear, including stepwise, and may be obtained by varying the local density of the modifying layer material (e.g. dot density). However, similar effects can be obtained by varying dot or island size, shape and or spacing, and also by spatially varying the composition of the modifying material.

The material of the modifying layer material may be an electrically conductive material, whereby to control the resistivity and/or electromagnetic impedance (e.g. at radio frequencies) presented by the surface. In general the surface permittivity (for example may be controlled by appropriate selection of a modifying layer material with electrical properties.

Alternatively, the material of the modifying layer may comprise, for example, a ferromagnetic, ferrimagnetic or antiferrimagnetic material to modify the magnetic permeability of the substrate surface. Typical magnetic materials for use in the modifying layer of the invention are iron, which could be deposited by electrodeposition, and a ferrite, which could be incorporated into an ink for screen printing).

More than one modifying layer may be provided in sequence over the substrate surface. For example an electrical modifying layer may be deposited before or after the deposition of a magnetic modifying layer, and the two layers may or may not be coextensive. A plurality of electric and magnetic modifying layers may be provided, for example over the same area of the substrate surface and preferably in alternating electric and magnetic order.

The islands or dots may have a regular shape, such as circular, triangular, square or other polygon, rectangular or elliptical, or their shape may be irregular or undefined. The islands or dots may be significantly elongate (e.g. with an aspect ratio of at least 5), and may be capable of acting, for example, as rf dipoles or inductors. Thus a significantly elongate rectangular shape may extend to what is essentially a linear region.

In part dot or island shape will be determined by their method of production, and also by the use to which the substrate will be put. Under most circumstances, preferably the maximum dimension of each dot or island is no more than 4 mm, more preferably no more than 2 mm, even more preferably no more than 1 mm, and most preferably no more than 0.5 mm. Preferably the minimum dimension of each dot or island is at least 5 microns, more preferably at least 50 microns, even more preferably at least 100 microns, and most preferably at least 200 microns.

The foregoing dimensions are particularly applicable to dots which approximate a square or circle. For dot or islands which are significantly elongate, it may be more appropriate to express size in terms of area, which is preferably no more than 16 $mm^2$, more preferably no more than 4 $mm^2$, even more preferably no more than 1 $mm^2$, and most preferably no more than 0.25 $mm^2$. Preferably the minimum area of each dot or island is at least 25 square microns, more preferably at least 2500 square microns, even more preferably at least $10^4$ square microns, and most preferably at least $4\times10^4$ square microns.

It is also possible to express dot or island dimensions in terms of the substrate size, and the desired variation of properties thereof. As a general rule, the substrate surface may be considered as being broken down into a large number of medium scale sub-areas areas each of which contains a respective number of dots or islands at a respective density (dots or islands per unit area). Island or dot density is one factor which can be used to determine the local electrical or magnetic property, and a variation thereof from sub-area to sub-area can be imposed to produce a variation in the electrical or magnetic property across the substrate surface. Within each sub-area there will be a large number of dots or islands. Generally the ratio of a sub-area dimension to a dot or island dimension may be at least 10:1, more preferably at least 20:1, and still more preferably at least 50:1. In a similar manner, generally the ratio of a dimension of the substrate which is covered to a sub-area dimension may be at least 10:1, more preferably at least 20:1, and still more preferably at least 50:1.

Where the dots or islands are significantly elongate it may be more appropriate to say that the ratio of a sub-area to a dot or island area may be at least 100:1, more preferably at least 400:1, and still more preferably at least 2500:1. In a similar manner, generally the ratio of the area of the substrate which is covered to a sub-area may be at least 100:1, more preferably at least 400:1, and still more preferably at least 2500:1.

Dot or island spacing will be determined by the desired surface property and the properties of the modifying layer material. Typically, dots or islands will be spaced by from 0.01 to 100 times their maximum dimension, or will cover between 2 to 90% of the substrate area, more preferably 5 to 75%, and still more preferably 10 to 50%.

The substrate is not necessarily a solid substrate. It may be, for example, a glass fibre sheet, or a similar woven or non-woven fabric. This fabric may be suitable for incorporation as a layer within a matrix or upon a support, e.g. a polymer support or matrix, for fabrication of a device using the modified substrate surface.

The substrate surface may be electrically insulating, and it may be desired to provide it with a degree of electrical conductivity, either uniform or varied as a function of position. As noted above, where the modifying layer material is deposited as islands, there is no continuous dc path. Nevertheless, it may serve as an impedance modifier for rf, for example at microwave frequencies.

For dc applications, it is possible to provide a substrate surface in the form of a relatively poor conductivity continuous coating on an insulating substrate, as by means of a carbon loaded screen printed layer, upon which the modifying layer material is disposed. The continuous coating also serves to smooth the variations in electrical conductivity exhibited locally by the surface. Alternatively, or additionally, a continuous poor conductivity coating may be overlaid upon the modifying layer.

In a modification, the aforesaid relatively poor conductivity coating(s) may be rendered incomplete and/or discontinuous, for example by physical perforation or chemical etching of a continuous layer, or by selective deposition of areas of the coating (i.e. using techniques similar to those used for provision of the modifying layer), to further modify the substrate surface properties. In such a case, the coating and the modifying layer are not expected to be fully coextensive on the small scale, i.e. at dot level, even for cases where they occupy the same substrate area overall. It is not always necessary for the modifying layer and poor conductivity coating to be coextensive on the large scale, i.e. over the same substrate area.

However, where the modifying layer comprises islands of uncovered substrate surface so that there is a continuous connection between different parts of the modifying layer, this alone may suffice to provide a degree of electrical conductivity at dc an ac frequencies including rf and microwave frequencies. Nevertheless, even here, an underlying and/or overlying poorly conducting layer may be provided as described above.

The material of the modifying layer may be a metallic (e.g. silver), carbon or semiconductor loaded screen printing ink. It may be physically protected by the provision of a overlayer which is appropriately electrically insulating and/or diamagnetic so as not to alter the modified property, for example a polymer or resin coating. The composition of the modifying layer material may also vary across the surface of the substrate.

The invention extends to a substrate having a surface over which is provided a modifying layer which is incomplete and has a distribution such as to provide a plurality of islands of said material and/or islands of substrate surface whereby the surface exhibits a modified electrical and/or magnetic property. This substrate may have any of the properties and/or constructions mentioned above in connection with the method, and may be produced by the method of the invention.

The invention also extends to a magnetic or electrical device comprising a substrate according to the invention. Thus the substrate may be, or form part of, an acoustic transducer such as a loudspeaker, microphone or sonar transducer, or a component for (or structure modified for) handling microwaves, or any other device where the desirability of having a variation in electrical and/or magnetic properties will be obvious to the skilled reader. It should be noted that in such devices, there will generally be a single input and/or output. This is to be contrasted with, for example, acoustic transducer arrays in which each transducer of the array receives its own input and/or provides its own output, as described for example in U.S. Pat. No. 4,117,074 (Tiersten), U.S. Pat. No. 6,012,779 (Morris) and International Patent Application No. WO 99/37123.

Furthermore, the present invention does not relate to the provision of an array of acoustic transducers on a surface where the electrical and/or magnetic properties of the surface are not per se modified. Thus, for example, while the foregoing prior art patents, and also UK Patent Application Serial No. 2 347 043 (Imperial College Innovations), UK Patent Application Serial No. 2 256 111 (University of Southampton) and European Patent Application Serial No. 0 372 583 (Hitachi Construction Machinery) may be considered to disclose piezoelectric substrates on which a patterned array of electrodes is deposited, so as to provide an acoustic transducer array, the electrical and/or magnetic surface properties of the piezoelectric substrate are not per se intended to be modified in the manner envisaged by the present invention.

Further features and advantages of the invention will become clear upon a consideration of the appended claims, to which the reader is referred, and to a perusal of the following description of some embodiments of the invention made by way of example and with reference to the accompanying drawings in which:

Figure 1:
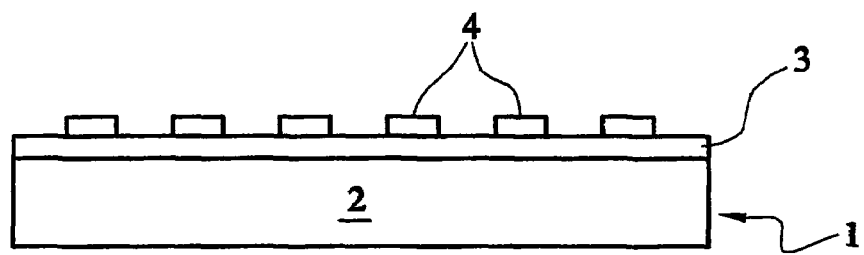
FIG. 1 is a side view illustrating a stage in a method of modifying a substrate surface according to the invention.

FIG. 1 shows a device 1 comprising a substrate 2 on the upper surface of which is deposited a modifying material 3, for example a very thin layer of nickel by electroless deposition, followed by a thicker electrolytically deposited copper. A mask 4 of carbon loaded ink is laid over the material 3 by screen printing, and the layer 3 is selectively chemically etched away. The substrate 2 may be a piezoelectric plate, for example.

Figure 2:
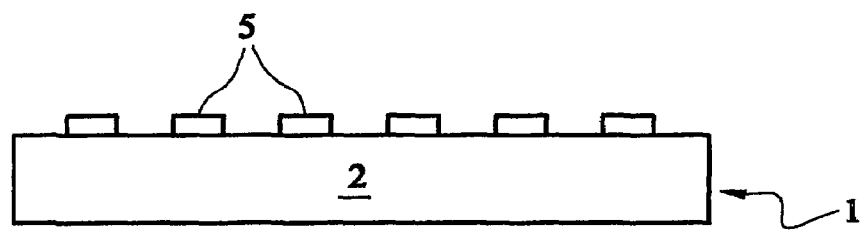
FIG. 2 is a side view of a first embodiment of a substrate produced from the method illustrated in FIG. 1.

FIG. 2 shows the device after etching and removal of the masking ink. The material 3 is now left as separate islands 5 on the surface 2, to provide a varying electrical or magnetic property across the surface of the substrate 2. The islands are of substantially equal size and shape, but distributed with a density which varies as a function of position on the substrate surface. In a variation, the size of the islands is also varies as a function of position.

In another form of the device 1, the material 3 is silver loaded screen printing ink, which is printed across a woven fabric insulating substrate 2 to provide a device exhibiting a variable electrical permittivity across the substrate surface.

Figure 3:
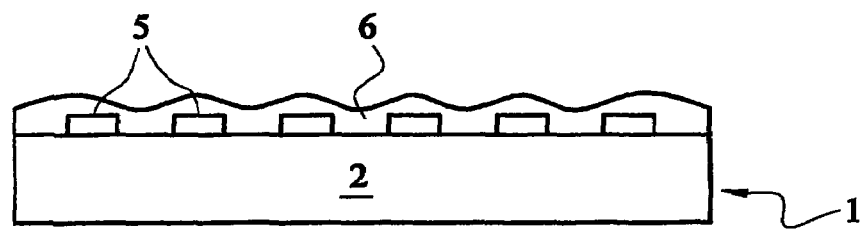
FIG. 3 is a side view of a second embodiment of a substrate being a modification of that shown in FIG. 2.

FIG. 3 shows a second embodiment of a device 1 similar to that of FIG. 2, but on which a poorly conductive carbon containing layer 6 has been subsequently applied over the islands 5 by screen printing. This device exhibits a dc surface resistance which varies as a function of position on the substrate surface.

Figure 4:
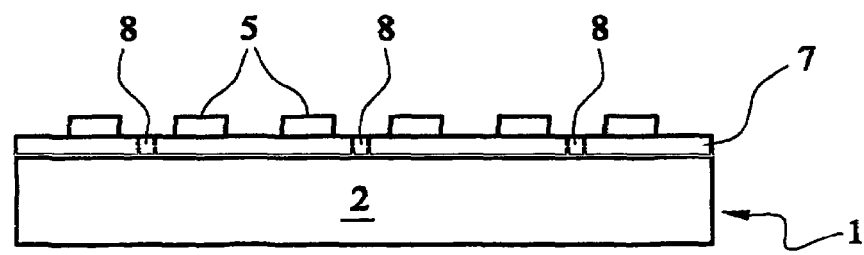
FIG. 4 is a side view of a third embodiment of a substrate being a modification of that shown in FIG. 2.

FIG. 4 shows a third embodiment of device 1 of similar construction to that of FIG. 2. However, in this case the substrate surface comprises a continuous poorly conducting screen printed carbon containing layer 7 prior to formation of the islands 5, which are deposited by screen printing.

Figure 5:
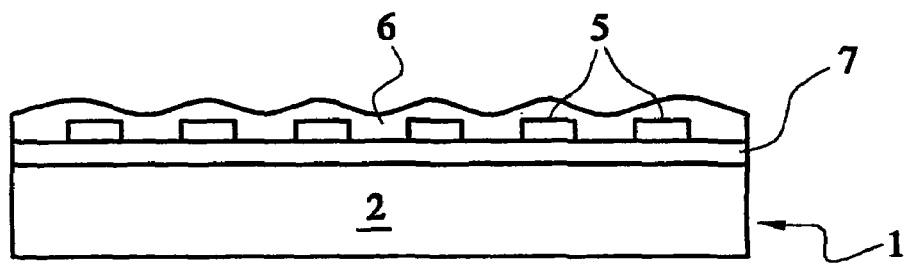
FIG. 5 is a side view of a fourth embodiment of a substrate being a modification of that shown in FIG. 2.

FIG. 5 shows a fourth embodiment of device 1 which made as that of FIG. 4 but with a further poorly conductive layer 6 over the islands so that the islands are sandwich between two such layers. Both the devices of FIGS. 4 and 5 exhibit a dc surface resistance which varies as a function of position on the substrate surface.

Also illustrated by dashed lines in FIG. 4 are optional perforations 8 which are formed physically in the layer before and/or after the provision of the islands 5. As can be seen, perforations 8 do not coincide with the islands and have a variable spatial relation therewith.

Figure 6:
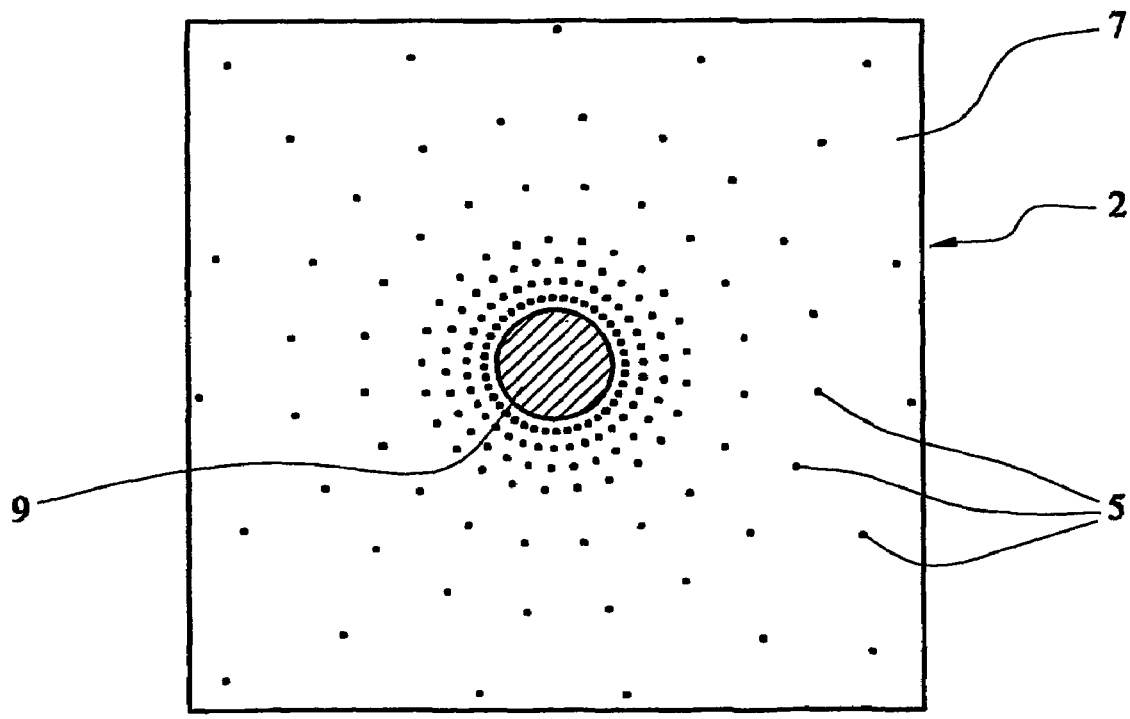
FIG. 6 illustrates a sonar transducer having a substrate surface with patterned electrical and/or magnetic surface properties provided by the invention.

FIG. 6 shows a schematic plan view of the device 1 of any of FIGS. 2 to 6 in the form of an acoustic sonar transducer, where the substrate 2 is a 2 mm thick piezoelectric plate of polyvinylidene difluoride approximately 15 cm square which is coated with an unbroken carbon containing layer 7. Over the layer 7 is applied by a single screen printing step using silver loaded ink a central electrode 9 of about 1 cm diameter surrounded by a distribution of discrete islands 5 of conductive material. The islands are all substantially equal in size and shape, for example 0.5 mm diameter circular dots, and they are distributed such that their density on the substrate surface decreases non-linearly with distance from the central electrode, from around 95% immediately adjacent the central electrode 9 to around 5% adjacent the edge of the substrate, where the percentages indicate the amount of coverage of the substrate area by the dots. A silver containing unbroken (continuous) counter-electrode is deposited over the reverse surface of the substrate 2 by screen printing.

At higher frequencies, around 40 kHz, only the region of the transducer associated with the central dots is effectively active, but as the frequency decreases to around 8 kHz regions or the transducer associated with outer dots also become progressively active, until the whole of the plate area under the dots is involved.

It will be appreciated that other functions of dot density with radius could be used, including an increasing density with radial distance, a linear variation with radius, or an exponential variation with radius, or even functions which are not monotonic, depending on the required characteristics.

FIG. 6 could be used equally to illustrate a device in which dot-like islands of uncovered substrate appear between an otherwise continuous conductive modifying layer.

The invention claimed is:

1. A substrate having at least one surface region which includes an electrically resistive medium which extends substantially continuously across said region and an electrical modifying layer of electrically conductive material in electrical contact with said electrically resistive medium, said electrically conductive material having a distribution such as to provide a plurality of islands of said material constituting said electrical modifying layer wherein the islands do not form a net of electrically conductive material.

2. A substrate according to claim 1 wherein the electrically resistive medium is provided by the substrate itself.

3. A substrate according to claim 1 wherein the electrically resistive medium is provided by at least one layer of electrically resistive material.

4. A substrate according to claim 3 wherein a said electrically resistive layer is located between the substrate and the electrical modifying layer.

5. A substrate according to claim 3 wherein the electrical modifying layer is located between a said electrically resistive layer and the substrate.

6. A substrate according to claim 3 wherein the electrically resistive medium is physically incomplete.

7. A substrate according to claim 1 wherein the distribution of the electrical modifying layer varies as a function of position on the substrate surface.

8. A substrate according to claim 1 wherein the composition of the electrical modifying layer varies as a function of position on the substrate surface.

9. A substrate according to claim 1 wherein the shape of the islands is a predetermined non-random shape.

10. A substrate according to claim 9 wherein the said shape is elongate.

11. A substrate according to claim 9 wherein said shape is elongate with an aspect ratio of at least 5.

12. A substrate according to claim 1 wherein at least one magnetic modifying layer comprising a ferromagnetic, ferrimagnetic or antiferrimagnetic material is also provided in said region.

13. A substrate according to claim 12 wherein said ferromagnetic, ferrimagnetic or antiferrimagnetic material has a distribution such as to provide a plurality of islands and/or a net of said ferromagnetic, ferrimagnetic or antiferrimagnetic material constituting said magnetic modifying layer.

14. A substrate according to claim 1 and including a plurality of said electrical modifying layers.

15. A substrate according to claim 1 wherein the substrate is a woven or non-woven fabric.

16. A device comprising a substrate according to claim 1, wherein the substrate is incorporated within a matrix, for example of a polymer, or is mounted on a support, for example of a polymer.

17. An acoustic device comprising a substrate according to claim 1.

18. An rf responsive device comprising a substrate according to claim 1.

19. A substrate according to claim 1 wherein the electrically resistive medium provides a dc conductive path across said region.

20. A substrate according to claim 1 wherein said electrically conductive material has a distribution such as to provide on the or each said region a plurality of islands of said electrically conductive material constituting said electrical modifying layer so as to vary an average electrical property of the surface as a function of position thereon.

21. A method of modifying a surface of a substrate by providing an electrical modifying layer of an electrically conductive material over at least one region of said surface and in electrical contact with an electrically resistive medium which extends substantially continuously across said region, said electrically conductive material having a distribution such as to provide on the or each said region a plurality of islands of said electrically conductive material constituting said electrical modifying layer wherein the islands do not form a net of electrically conductive material.

22. A method according to claim 21 wherein the electrically resistive medium is provided by the substrate itself.

23. A method according to claim 21 wherein the electrically resistive medium is provided by at least one substantially continuous layer of electrically resistive material in contact with the modifying layer.

24. A method according to claim 23 wherein a said electrically resistive layer is provided between the substrate and said electrically conductive material.

25. A method according to claim 23 wherein said electrically conductive material is provided between said electrically resistive layer and the substrate.

26. A method according to claim 21 wherein the distribution of said electrically conductive material is varied as a function of position on the substrate surface.

27. A method according to claim 21 wherein said electrically conductive material is deposited directly in the said distribution.

28. A method according to claim 21 wherein said electrically conductive material is initially deposited on said region as a substantially continuous layer, and thereafter removing parts of the substantially continuous layer of electrically conductive layer to provide said distribution.

29. A method according to claim 21 wherein the composition of said electrically conductive material is varied as a function of position on the substrate surface.

30. A method according to claim 21 wherein the distribution of electrically conductive material comprises a plurality of islands having a predetermined non-random shape.

31. A method according to claim 30 wherein said shape is elongate.

32. A method according to claim 30 wherein said shape is elongate with an aspect ratio of at least 5.

33. A method according to claim 21 comprising the step of providing a plurality of said electrical modifying layers over said at least one region of said surface.

34. A method according to claim 21 wherein said substrate is a woven or non-woven fabric.

35. A method according to claim 21 comprising the further step of incorporating said substrate within a matrix of a polymer, or mounting said substrate on a support, for example of a polymer.

36. A substrate having a surface modified according to the method of claim 20.

37. A method according to claim 21 wherein said electrically conductive material has a distribution such as to provide on the or each said region a plurality of islands of said electrically conductive material constituting said electrical modifying layer so as to vary an average electrical property of the surface as a function of position thereon.

38. A substrate having a surface over at least a region of which is provided a magnetic modifying layer comprising a ferromagnetic, ferrimagnetic or antiferrimagnetic material which has a distribution such as to provide a plurality of islands of said material constituting said magnetic modifying layer wherein the islands do not form a net of electrically conductive material.

39. A substrate according to claim 38 wherein the distribution of the ferromagnetic, ferrimagnetic or antiferrimagnetic material varies as a function of position on the substrate surface.

40. A substrate according to claim 38 wherein the composition of the ferromagnetic, ferrimagnetic or antiferrimagnetic material varies as a function of position on the substrate surface.

41. A substrate according to claim 38 wherein the shape of the islands is a predetermined non-random shape.

42. A substrate according to claim 41 wherein the said shape is elongate.

43. A substrate according to claim 41 wherein said shape is elongate with an aspect ratio of at least 5.

44. A substrate according to claim 38 wherein the substrate is a woven or non-woven fabric.

45. A substrate according to claim 38 wherein an electrical modifying layer is also provided on said region, the material of said modifying layer being electrically conductive and having a distribution such as to provide a plurality of islands or a net of said electrically conductive material constituting said electrical modifying layer.

46. A device comprising a substrate according to claim 38, wherein the substrate is incorporated within a matrix, for example of a polymer, or is mounted on a support, for example of a polymer.

47. A method of modifying a surface of a substrate by providing a magnetic modifying layer comprising a ferromagnetic, ferrimagnetic or antiferrimagnetic material over at least one region of said surface, the ferromagnetic, ferrimagnetic or antiferrimagnetic material having a distribution such as to provide on the or each said region a plurality of islands of said ferromagnetic, ferrimagnetic or antiferrimagnetic material constituting said magnetic modifying layer wherein the islands do not form a net of electrically conductive material.

48. A method according to claim 47 wherein an electrical modifying layer is also provided on said region, the material of said electrical modifying layer being electrically conductive and having a distribution such as to provide on the or each said region a plurality of islands and/or a net of said electrically conductive material.

49. The method according to claim 48 wherein a said electrical modifying layer is provided after provision of a said magnetic modifying layer.

50. A method according to claim 48 wherein a said electrical modifying layer is provided before provision of a said magnetic modifying layer.

51. A method according to claim 47 wherein the material of at least one said modifying layer is deposited directly in the said distribution.

52. A method according to claim 47 wherein the material of at least one said modifying layer is initially deposited on said region as a substantially continuous layer, and parts thereof are then removed to provide said distribution.

53. A method according to claim 47 wherein the distribution of said ferromagnetic, ferrimagnetic or antiferrimagnetic material comprises a plurality of islands having a predetermined non-random shape.

54. A method according to claim 53 wherein said shape is elongate.

55. A method according to claim 53 wherein said shape is elongate with an aspect ratio of at least 5.

56. A method according to claim 47 wherein said substrate is a woven or non-woven fabric.

57. A method according to claim 47 comprising the further step of incorporating said substrate within a matrix, for example of a polymer, or mounting said substrate on a support, for example of a polymer.

58. A substrate having a surface modified according to the method of claim 47.

* * * * *